United States Patent
Nonaka et al.

(10) Patent No.: US 10,526,704 B2
(45) Date of Patent: Jan. 7, 2020

(54) FILM FORMING APPARATUS

(71) Applicant: ASM IP Holding B.V., Almere (NL)

(72) Inventors: Yuya Nonaka, Kawasaki (JP); Yozo Ikedo, Machida (JP)

(73) Assignee: ASM IP HOLDING B.V., Almere (NL)

( * ) Notice: Subject to any disclaimer, the term of this patent is extended or adjusted under 35 U.S.C. 154(b) by 472 days.

(21) Appl. No.: 14/609,758

(22) Filed: Jan. 30, 2015

(65) Prior Publication Data

US 2016/0222513 A1 Aug. 4, 2016

(51) Int. Cl.
*C23C 16/00* (2006.01)
*C23C 16/455* (2006.01)
*C23C 16/50* (2006.01)

(52) U.S. Cl.
CPC ........ *C23C 16/45578* (2013.01); *C23C 16/50* (2013.01)

(58) Field of Classification Search
CPC .......................... C23C 16/45578; C23C 16/50
USPC .................................................... 156/345.34
See application file for complete search history.

(56) References Cited

U.S. PATENT DOCUMENTS

| | | | | |
|---|---|---|---|---|
| 6,197,151 B1* | 3/2001 | Kaji | ................... | H01J 37/32678 118/723 E |
| 7,721,673 B2* | 5/2010 | Du | ..................... | H01J 37/32009 118/723 E |
| 2009/0061088 A1* | 3/2009 | Von Der Waydbrink | ................... | C23C 14/24 427/255.5 |
| 2009/0211707 A1* | 8/2009 | Chao | ................. | C23C 16/45565 156/345.34 |
| 2009/0288602 A1* | 11/2009 | Satake | ................ | C23C 16/4412 118/723 E |

FOREIGN PATENT DOCUMENTS

| | | |
|---|---|---|
| JP | 2000-195812 A | 7/2000 |
| JP | 2001-189308 A | 7/2001 |

* cited by examiner

*Primary Examiner* — Keath T Chen
(74) *Attorney, Agent, or Firm* — Studebaker & Brackett PC

(57) ABSTRACT

A film forming apparatus includes a chamber having a processing space, a stage provided in the processing space and having a substrate placed thereon, a diffusion tube connected to the chamber so that a diffusion space communicating with the processing space is provided right above the stage, and a gas supply tube extending from the outside of the diffusion tube into the diffusion space through a portion of the diffusion tube and having a gas supply orifice in a portion thereof inside of the diffusion space. The gas supply orifice is formed so as to eject a material gas in a direction away from the stage.

4 Claims, 8 Drawing Sheets

| | | ITEM 1 | | ITEM 2 | | ITEM 3 | | |
|---|---|---|---|---|---|---|---|---|
| | | ANGLE | | SIZE | | NUMBER | | TUNING |
| NOZZLE | | W/O | WITH | WITH | WITH | WITH | WITH | WITH |
| ANGLE [°] | | – | 180° | 0° | 180° | 180° | 180° | 180° | 180° |
| SIZE [mm] | | – | 5.6mm | 5.6mm | 5.6mm | 2.8mm | 5.6mm | 2.5mm | 1.0mm |
| NUMBER [ea] | | – | 1 | 1 | 1 | 1 | 1 | 5 | 5 |
| THK [nm] | EE1.5 | 49 | 53 | 53 | 53 | 59 | 52 | 52 | 51 |
| RANGE [±%] | EE3.0 | 1.53 | 1.53 | 3.07 | 1.53 | 0.85 | 1.44 | 1.22 | 1.22 |
| RANGE [±%] | EE1.5 | 2.31 | 2.10 | 3.79 | 2.10 | 1.44 | 1.48 | 1.46 | 1.37 |
| X LINE [±%] | EE1.5 | 1.44 | 1.35 | 2.36 | 1.35 | 1.05 | 1.42 | 0.94 | 0.77 |

※RANGE (THICKNESS UNIFORMLTY) = {(Tmax−Tmin)/(2×Tave)} × 100 [%]

FILM FORMING APPARATUS

BACKGROUND OF THE INVENTION

Field of the Invention

The present invention relates to a film forming apparatus for forming a film on a substrate.

Background Art

Japanese Patent Laid-Open No. 2001-189308 discloses a film forming apparatus that generates a plasma between an upper electrode having gas introduction holes through which a material gas used for film forming passes and a lower electrode. In this film forming apparatus, the number of gas introduction holes per unit area is changed with respect to in-plane positions in the upper electrode so that a film forming gas is concentratedly introduced to a place where the film forming speed is low.

There is a problem that if the density of the gas introduction holes in the electrode is adjusted as in the art disclosed in Japanese Patent Laid-Open No. 2001-189308, not only the amount of supply of the material gas but also the plasma concentration is changed. Thus, film thickness uniformity in a substrate surface is improved by sacrificing the controllability of the film quality.

SUMMARY OF THE INVENTION

In order to solve the above-described problem, an object of the present invention is to provide a film forming apparatus capable of improving the film thickness uniformity in the substrate surface without any disadvantage effect.

The features and advantages of the present invention may be summarized as follows.

According to one aspect of the present invention, a film forming apparatus includes a chamber having a processing space, a stage provided in the processing space and having a substrate placed thereon, a diffusion tube connected to the chamber so that a diffusion space communicating with the processing space is provided right above the stage, and a gas supply tube extending from the outside of the diffusion tube into the diffusion space through a portion of the diffusion tube and having a gas supply orifice in a portion thereof inside of the diffusion space. The gas supply orifice is formed so as to eject a material gas in a direction away from the stage.

According to another aspect of the present invention, a film forming apparatus includes a chamber having a processing space, a stage provided in the processing space and having a substrate placed thereon, a diffusion tube connected to the chamber so that a diffusion space communicating with the processing space is provided right above the stage, and a gas supply tube extending from the outside of the diffusion tube into the diffusion space through a portion of the diffusion tube and having a plurality of gas supply orifices in a portion thereof inside of the diffusion space. The plurality of gas supply orifices is formed so as to eject a gas toward a side surface of the diffusion tube.

Other and further objects, features and advantages of the invention will appear more fully from the following description.

DETAILED DESCRIPTION OF THE PREFERRED EMBODIMENTS

Figure 1:
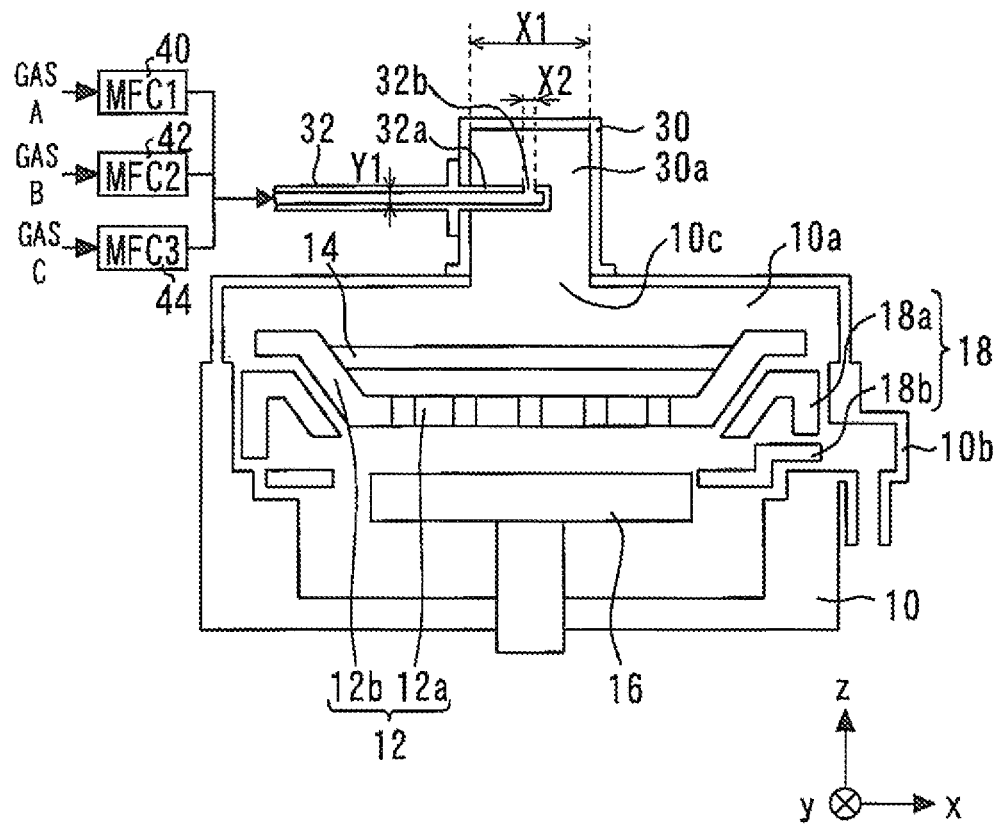
FIG. 1 is a sectional view of a film forming apparatus according to a first embodiment.

A film forming apparatus according to embodiments of the present invention will be described with reference to the drawings. Components identical or corresponding to each other are indicated by the same reference characters and repetition of some descriptions may be avoided.

First Embodiment

FIG. 1 is a sectional view of a film forming apparatus according to a first embodiment of the present invention. This film forming apparatus is provided with a chamber 10. A space in the chamber 10 is a processing space 10a in which a substrate is processed. The chamber 10 is provided with an exhaust duct 10b. An electrode 12 is provided in the processing space 10a. The electrode 12 has a flat portion 12a in which openings are formed, and a side wall portion 12b surrounding the flat portion 12a. An intermediate plate 14 having openings is provided above the flat portion 12a. The intermediate plate 14 is formed of an insulating material, e.g., a ceramic to prevent electric discharge mainly between the electrode 12 and the chamber 10.

A stage 16 on which a substrate is placed is provided in the processing space 10a. The stage 16 is formed of a metallic member opposed to the electrode 12. An insulating member 18 for securing insulation between the stage 16 and the electrode 12 is provided between the stage 16 and the electrode 12. The insulating member 18 has a first portion 18a having a shape conforming to the shape of the electrode 12 and a second portion 18b provided below the first portion 18a.

A diffusion tube 30 is connected to the chamber 10. The diffusion tube 30 has, for example, a cylindrical shape with its inside diameter X1 being 80 mm. A space in the diffusion tube 30 is a diffusion space 30a. The diffusion space 30a communicates with the processing space 10a through an opening 10c of the chamber 10. The diffusion space 30a is provided right above the stage 16. In some cases, the diffusion tube 30 is called a transport tube.

A gas supply tube 32 is fixed on the diffusion tube 30, for example, with screws. Through the gas supply tube 32, a material gas is supplied into the diffusion space 30a. The gas supply tube 32 extends from the outside of the diffusion tube 30 into the diffusion space 30a through a portion of the diffusion tube 30. The portion of the gas supply tube 32 inside of the diffusion space 30a is called a distal end portion 32a. A gas supply orifice 32b is formed in the distal end portion 32a. The gas supply orifice 32b is formed so as to eject a gas in a direction away from the stage 16.

The opening area of the gas supply orifice 32b and the sectional area of a hollow space in the gas supply tube 32 are equal to each other. For example, the bore X2 of the gas supply orifice 32b is 5.6 mm, and the bore Y1 of the gas supply tube 32 is also 5.6 mm.

A mass flow controller (MFC 40) for supplying gas A, a mass flow controller (MFC 42) for supplying gas B and a mass flow controller (MFC 44) for supplying gas C are connected to the gas supply tube 32. Gases A, B, and C are not particularly specified. For example, as some of gases A, B, and C, silane ($SiH_4$) and $N_2O$, tetraethoxysilane (TEOS) and $O_2$ or bis(diethylamino)silane (BDEAS) and $O_2$ are used in the case of $SiO_2$ film forming. Tetra-kis dimethyl amino titanium (TDMAT) and $O_2$ are used in the case of TiO film forming. Many kinds of material gases may be supplied into the diffusion space 30a.

Figure 2:
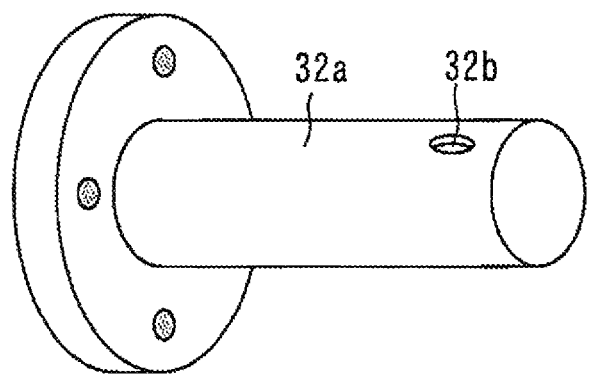
FIG. 2 is an enlarged view of the distal end portion of the gas supply tube.

FIG. 2 is an enlarged view of the distal end portion 32a of the gas supply tube 32. The gas supply orifice 32b is provided only in one place close to the distal end of the tubular distal end portion 32a.

Figure 3:
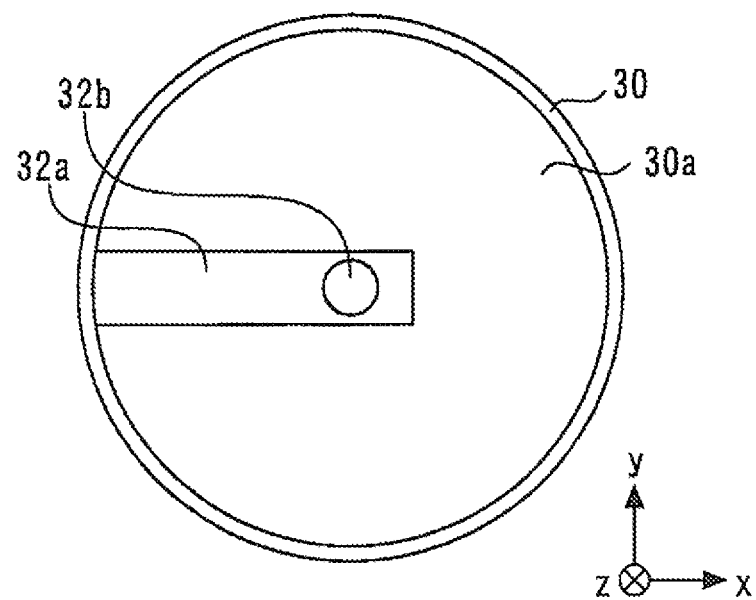
FIG. 3 is a plan view of the gas supply tube and the side wall of the diffusion tube.

FIG. 3 is a plan view of the gas supply tube 32 and the side wall of the diffusion tube 30. The gas supply orifice 32b is provided at a center of the diffusion space 30a as viewed in plan. The gas supply orifice 32b is formed so as to eject a gas toward the upper wall surface of the diffusion tube 30.

Figure 4:
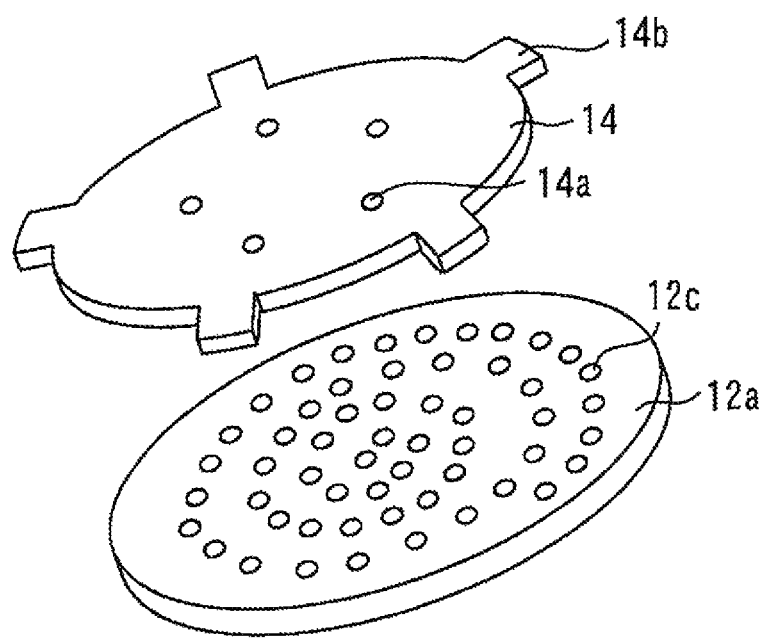
FIG. 4 is a perspective view of the intermediate plate and the flat portion of the electrode.

FIG. 4 is a perspective view of the intermediate plate 14 and the flat portion 12a of the electrode 12. A plurality of openings 12c is provided in the flat portion 12a of the electrode 12. The plurality of openings 12c is formed in spiral form as a whole. Openings 14a are formed in the intermediate plate 14. Projections 14b are provided on the intermediate plate 14 at the outer periphery. The intermediate plate 14 is fixed on the electrode 12 with the projections 14b in contact with the electrode 12 (side wall portion 12b).

Figure 5:
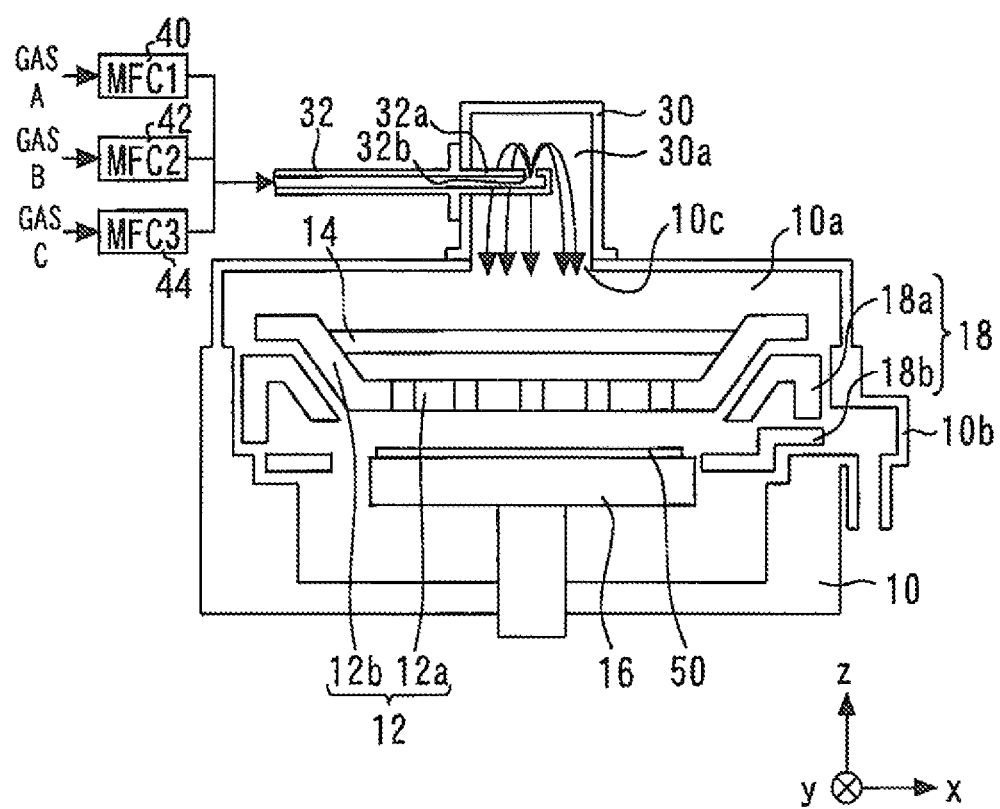
FIG. 5 is a diagram showing flows of a material gas.

FIG. 5 is a diagram showing flows of a material gas and the like at the time of film forming using the film forming apparatus according to the first embodiment. A substrate 50, which is a member on which a film is to be formed, is placed on the stage 16. The film forming apparatus is constructed as a plasma film forming apparatus that applies a voltage between the stage 16 and the electrode 12 provided above the stage 16. The electrode 12 is a radio frequency electrode, while the stage 16 is a ground electrode. In a case where three material gases are used, the material gases are supplied from the MFCs 40, 42, and 44 to the gas supply tube 32. The material gases move forward in the gas supply tube 32 while mixing with each other in the gas supply tube 32. The material gases are ejected upward from the gas supply orifice 32b to diffuse widely in the diffusion space 30a. The material gases then move from the diffusion space 30a into the processing space 10a to be supplied onto the stage 16 via the openings 14a of the intermediate plate 14 and the openings 12c of the electrode 12.

Figures 6, 7:
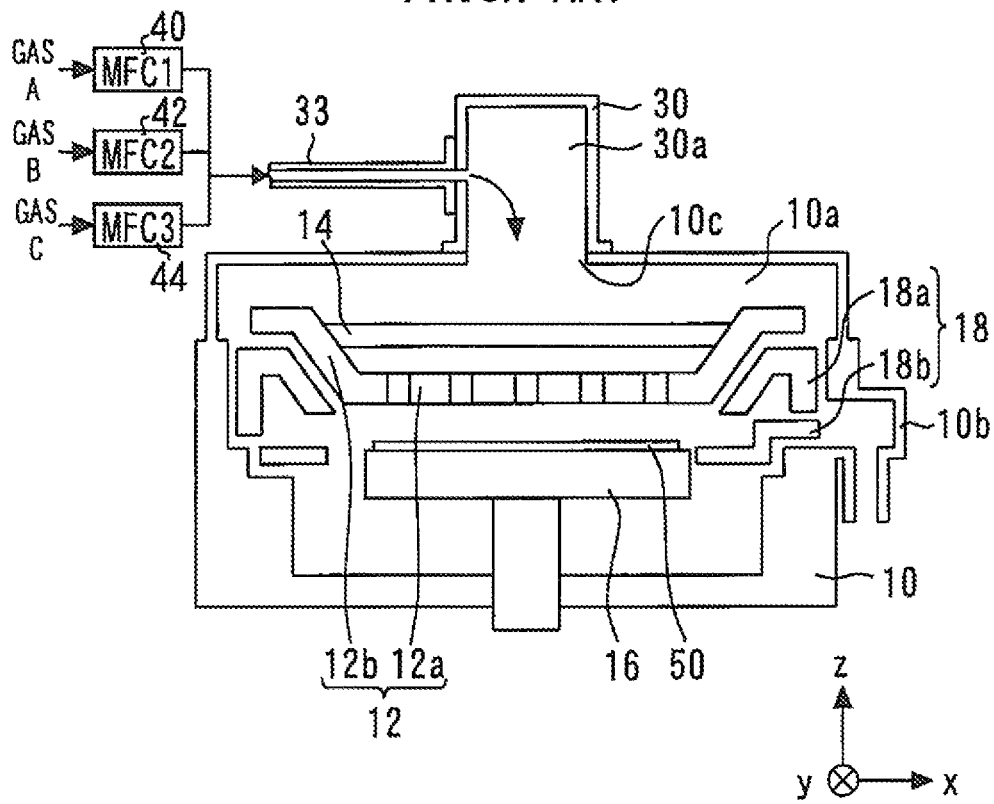
FIG. 6 is a sectional view of a film forming apparatus according to the comparative example.
FIG. 7 is a table showing experimental results.

To facilitate understanding of features of the film forming apparatus of the present invention, a comparative example will be described. FIG. 6 is a sectional view of a film forming apparatus according to the comparative example. In the film forming apparatus according to the comparative example, the distal end of the gas supply tube 33 is in contact with a side surface of the diffusion tube 30. That is, no part of the gas supply tube 33 is inside the diffusion space 30a. Accordingly, a material gas is supplied from the side surface of the diffusion tube 30 into the diffusion space 30a. The material gas supplied into the diffusion space 30a moves rapidly toward the processing space 10a, as indicated by arrows in the diffusion space 30a. In this case, the material gas does not diffuse sufficiently in the diffusion space 30a, so that the material gas tends to be concentrated on a particular portion on the substrate 50.

On the contrary, in the film forming apparatus according to the first embodiment of the present invention, a material gas is ejected from the gas supply orifice 32b in a direction away from the stage 16. Therefore, the material gas diffuses widely in the diffusion space 30a before being supplied into the processing space 10a. As a result, the material gas is supplied onto the substrate 50 generally uniformly, thus improving film thickness uniformity in the substrate surface.

A method of improving the film thickness uniformity by optimizing the shapes or densities of the openings in the intermediate plate 14 and the electrode 12 is also conceivable. If the shape or density of the openings in the intermediate plate 14 is changed, the electric discharge prevention effect of the intermediate plate 14 is changed. More specifically, a margin with respect to upper discharge as discharge between the electrode 12 and the chamber 10 above the electrode 12 is changed. A change in the shape or density of the openings in the electrode 12 results in a change in the density of plasma on the substrate. That is, the controllability of a film quality formed on the substrate is reduced. Accordingly, it is safe to avoid changing the shape or density of the openings in the intermediate plate 14 or the electrode 12, since other parameters (process parameters) are affected.

On the other hand, in the film forming apparatus according to the first embodiment of the present invention, the gas supply tube 32 is used to improve the film thickness uniformity in the substrate surface, and there is no need to change the existing devices including the intermediate plate 14 or the electrode 12. That is, use of the gas supply tube 32 enables avoiding the problem of a change in the margin with respect to upper discharge and a change in plasma density.

FIG. 7 is a table showing the relationships between the angle, size, and number of gas supply orifices and the film thickness uniformity in the substrate surface experimentally examined and collected. "NOZZLE" denotes the distal end portion 32a shown in FIG. 1. "ANGLE" indicates the direction of the gas supply orifice. ANGLE 0° indicates a case where the gas supply orifice faces downward (Z-negative direction) and a material gas is ejected in a direction toward the stage 16. ANGLE 180° indicates a case where the gas supply orifice faces upward (Z-positive direction) and a material gas is ejected in a direction opposite to a direction toward the stage 16.

"SIZE" indicates the bore of the gas supply orifice. "NUMBER" indicates the number of gas supply orifices. "THK" indicates the average of the thickness of a film formed on a substrate.

"RANGE" is an indicator for the film thickness uniformity in the substrate surface. More specifically, "RANGE" is a value obtained by measuring film thickness T at arbitrary forty-nine points on a 300 mm substrate and calculating an equation:

$$\{(T\mathrm{max}-T\mathrm{min})/(2\times T\mathrm{ave})\}\times 100 [\%] \qquad \text{equation 1}$$

"EE (edge exclusion)" indicates to which extent from the outer periphery of the substrate a region where the film thickness is not measured is set. For example, in the case of EE1.5, the film thickness is not measured in a region having a width of 1.5 mm from the outer periphery of the substrate. Accordingly, the portion in which the film thickness is measured in the case of EE1.5 is closer to the outer periphery of the substrate than the portion in which the film thickness is measured in the case of EE3.0, and the film thickness uniformity in the substrate surface tends to degrade in the case of EE1.5 in comparison with the case of EE3.0.

"X LINE" is also an indicator for the film thickness uniformity in the substrate surface. More specifically, "X LINE" is a value obtained by measuring film thickness T at forty-nine points along a straight line on a 300 mm substrate and substituting each thickness value in equation 1 shown above. In both of the cases of indication with RANGE and indication with X LINE, the smaller the value, the higher the film thickness uniformity in the substrate surface.

ITEM 1 is an item in which mainly relationships between ANGLE and "film thickness uniformity in substrate surface" are collected. When ANGLE is 180°, RANGE (EE1.5) is 2.10. When ANGLE is 0°, RANGE (EE1.5) is 3.79. With respect to X LINE, it can also be understood that the film thickness uniformity in the substrate surface in the case of setting ANGLE to 180° is higher than that in the case of setting ANGLE to 0°. It is, therefore, preferable to set ANGLE to 180°.

Experimental results in a case where no NOZZLE exists are also shown in ITEM 1. In this case, ANGLE is 90° because the distal end of the gas supply tube is fixed in a side surface of the diffusion tube, as in the comparative example. The film thickness uniformity in the substrate surface when ANGLE is 90° is an intermediate value between that when ANGLE is 180° and that when ANGLE is 0°.

When ANGLE is 0°, the material gas flows straight toward the processing space and, therefore, the material gas is not sufficiently diffused in the diffusion space, resulting in degradation of the film thickness uniformity in the substrate surface. When ANGLE is 90°, the material gas is diffused in the diffusion space better than when ANGLE is 0°, so that the film thickness uniformity in the substrate surface is improved. When ANGLE is 180°, the material gas is diffused in the diffusion space more than when ANGLE is 90°, and the film thickness uniformity in the substrate surface can therefore be improved in comparison with the case where ANGLE is 90°.

Figure 8:
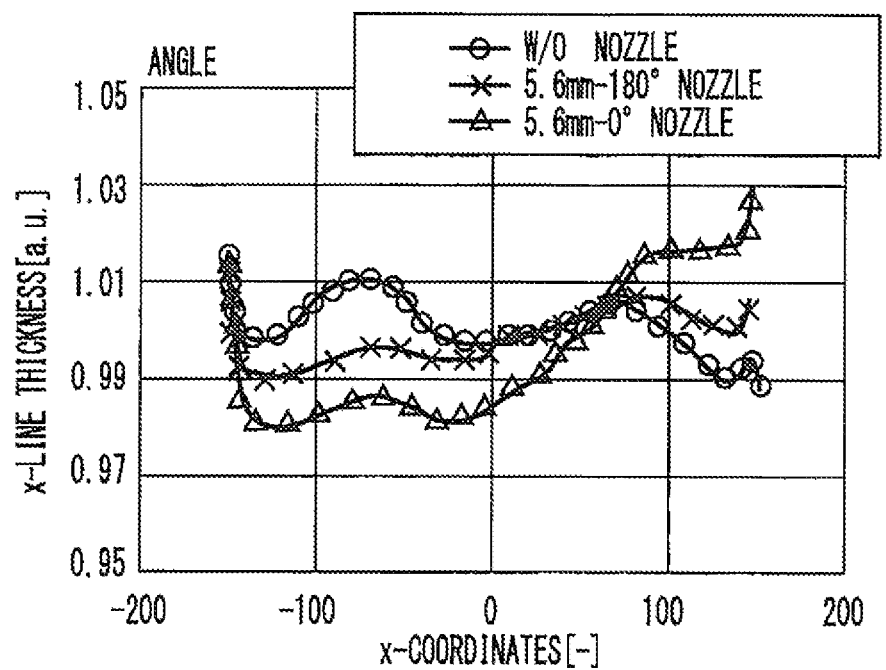
FIG. 8 shows an X-coordinate dependence of the film thickness.

From the experimental results with respect to ITEM 1, it can be understood that the material gas can be widely diffused in the diffusion space by increasing ANGLE from 90° and ejecting the material gas in a direction away from the stage 16. To eject the material gas in a direction away from the stage 16, ANGLE may be increased from 90°. FIG. 8 shows an X-coordinate dependence of the film thickness with respect to each of the three conditions in ITEM 1.

Figure 9:
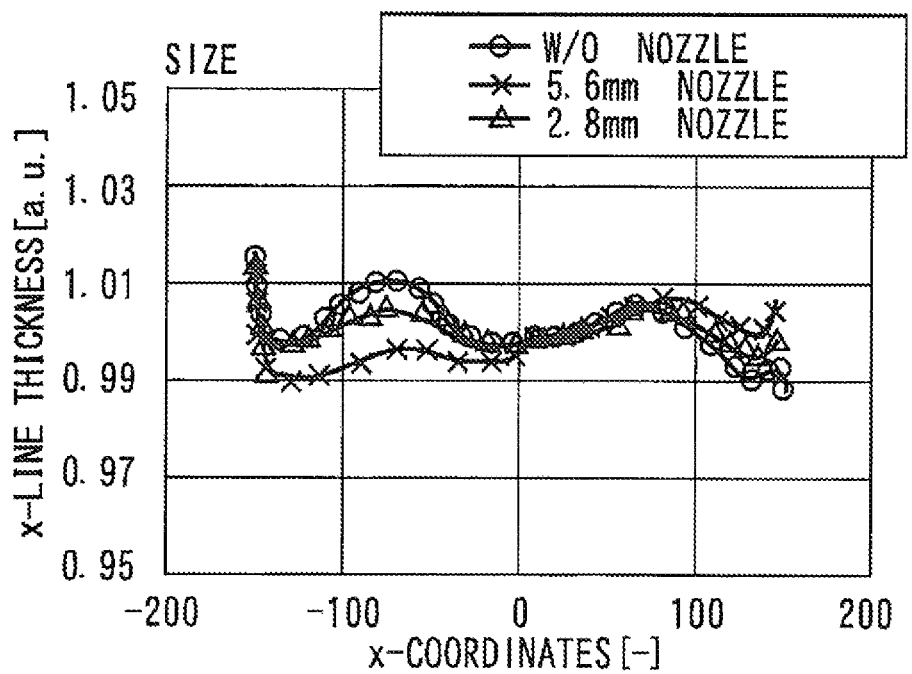
FIG. 9 shows an X-coordinate dependence of the film thickness.

ITEM 2 is an item in which relationships between SIZE (the bore of the gas supply orifice) and "film thickness uniformity in substrate surface" are collected. The film thickness uniformity in the substrate surface (RANGE, X LINE) is better when the bore of the gas supply orifice is 2.8 mm than when the bore of the gas supply orifice is 5.6 mm. The material gas can be widely diffused in the diffusion space 30a by reducing the bore of the gas supply orifice and powerfully ejecting the material gas. FIG. 9 shows an X-coordinate dependence of the film thickness with respect to the two conditions in ITEM 2 and the case where there is no nozzle (distal end portion).

Figure 10:
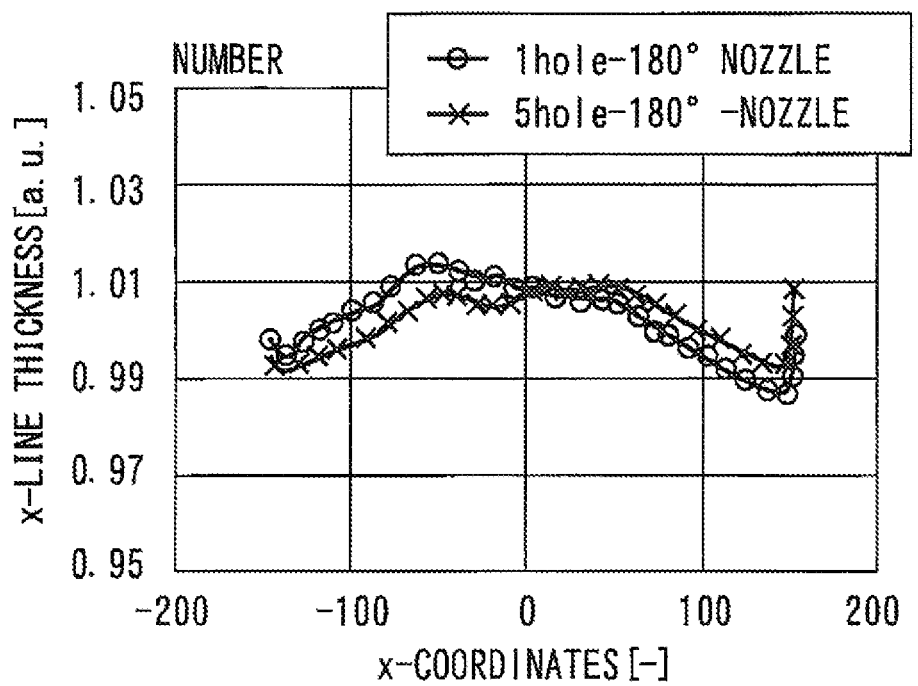
FIG. 10 shows an X-coordinate dependence of the film thickness.

ITEM 3 is an item in which relationships between NUMBER (the number of gas supply orifices) and "film thickness uniformity in substrate surface" are collected. When NUMBER is 5, the bore of the gas supply orifice is set to 2.5 mm in order that the total area of the gas supply orifices when NUMBER is 5 and the total area of the gas supply orifices when NUMBER is 1 be substantially equal to each other. When NUMBER is 5, all the gas supply orifices are disposed in the vicinity of the center of the diffusion space as viewed in plan. The film thickness uniformity in the substrate surface when NUMBER is 5 is higher than that when NUMBER is 1. The material gas can be widely diffused in the diffusion space by setting the number of gas supply orifices to a plural number. FIG. 10 shows an X-coordinate dependence of the film thickness with respect to the two conditions in ITEM 3.

Figure 11:
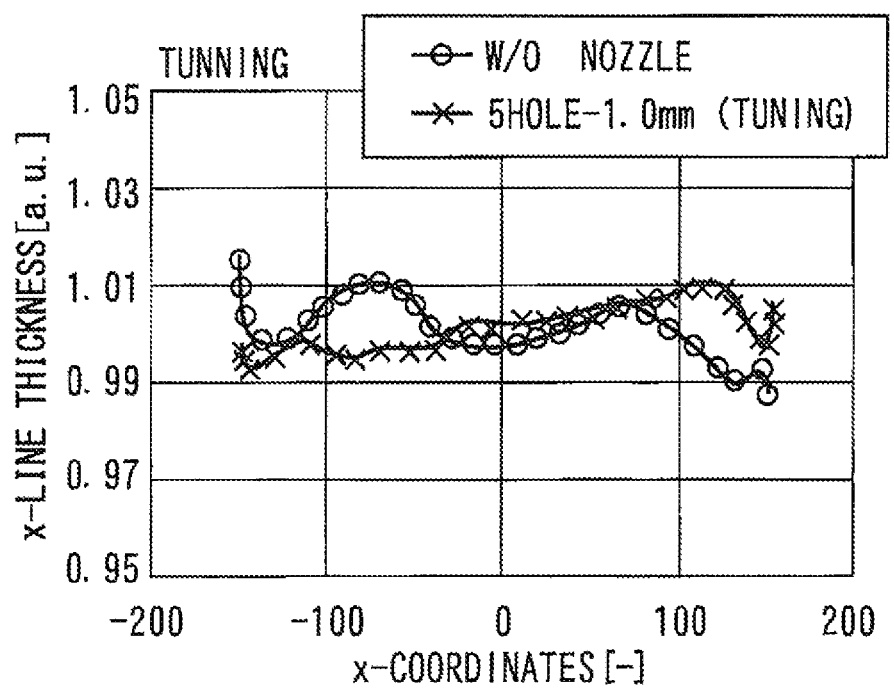
FIG. 11 shows an X-coordinate dependence of the film thickness.

FIG. 11 shows an X-coordinate dependence of the film thickness with respect to the no-NOZZLE condition at the leftmost side of FIG. 7 and the condition at the rightmost side of FIG. 7. In the condition at the rightmost side of FIG. 7, each of the bores of the five gas supply orifices was set to 1.0 mm. As a result, markedly good film thickness uniformity: RANGE (EE1.5) of 1.37 and X LINE of 0.77, was realized.

From the results with respect to ITEM 1 to ITEM 3, it is preferable to provide at the angle of 180° a plurality of gas supply orifices whose bore is set as small as possible. It is, therefore, preferable to set the opening area of the gas supply orifice 32b smaller than the sectional area of the hollow space in the gas supply tube 32, while the bore of the gas supply orifice 32b and the bore of the gas supply tube 32 are set equal to each other in the first embodiment of the present invention.

One of important features of the present invention is sufficiently diffusing a material gas in the diffusion space before supplying the material gas into the processing space. The film forming apparatus in the first embodiment can be variously modified as long as this feature is not lost. For example, the intermediate plate 14 may be removed. The gas supply tube 32 may be formed by combining a plurality of parts. An insulating film may be formed and a metal film may be formed. As a film forming method, plasma-enhanced CVD (PECVD), plasma-enhanced ALD (PEALD) or some other method may be used. These modifications can be applied as desired to film forming apparatuses according to embodiments described below. The film forming apparatuses according to the embodiments described below have a number of commonalities with the film forming apparatus in the first embodiment and will therefore be described mainly with respect to points of difference from the first embodiment.

Second Embodiment

Figure 12:
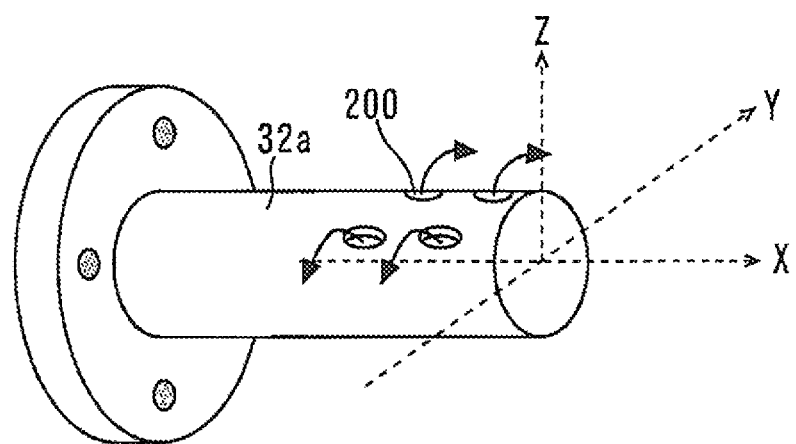
FIG. 12 is a perspective view showing a portion of the film forming apparatus according to the second embodiment.

FIG. 12 is a perspective view showing a portion of the film forming apparatus according to the second embodiment of the present invention. Four gas supply orifices 200 are formed in the distal end portion 32a. In terms of ANGLE defined in the first embodiment, the directions of the four gas supply orifices 200 are at angles larger than 90° and smaller than 180°. Therefore, a material gas is ejected from the four gas supply orifices 200 in directions away from the stage. The film thickness uniformity in the substrate surface can be improved in this way. The provision of the plurality of gas supply orifices enables a material gas to be widely diffused in the diffusion space. It is particularly effective to provide a plurality of gas supply orifices in such a manner that a material gas is ejected radially. Some plural number of gas supply orifices, not limited to four, may suffice.

Third Embodiment

Figure 13:
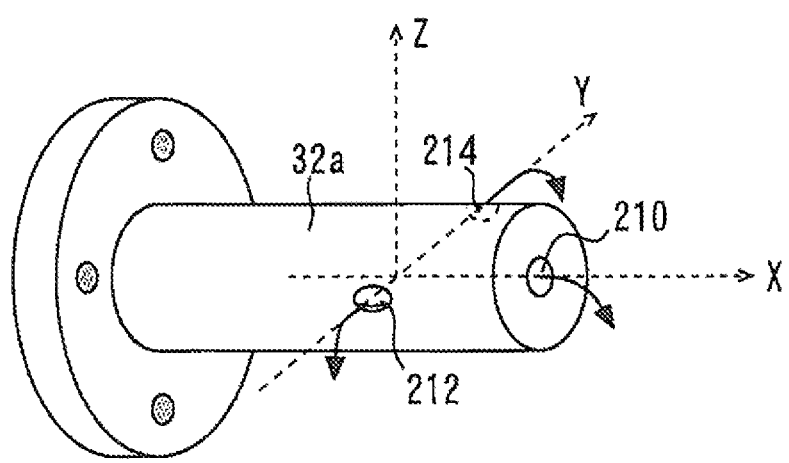
FIG. 13 is a perspective view showing a portion of the film forming apparatus according to the third embodiment.

FIG. 13 is a perspective view showing a portion of the film forming apparatus according to the third embodiment of the present invention. Three gas supply orifices 210, 212, and 214 are formed in the distal end portion 32a. In terms of ANGLE defined in the first embodiment, the directions of the gas supply orifices 210, 212, and 214 are at an angle of 90°. The gas supply orifices 210, 212, and 214 are formed so as to eject a material gas toward the side surface of the diffusion tube. A material gas can be widely diffused in the diffusion space by being ejected toward the side surface of the diffusion tube. Some plural number of gas supply orifices, not limited to three, may suffice.

Fourth Embodiment

Figure 14:
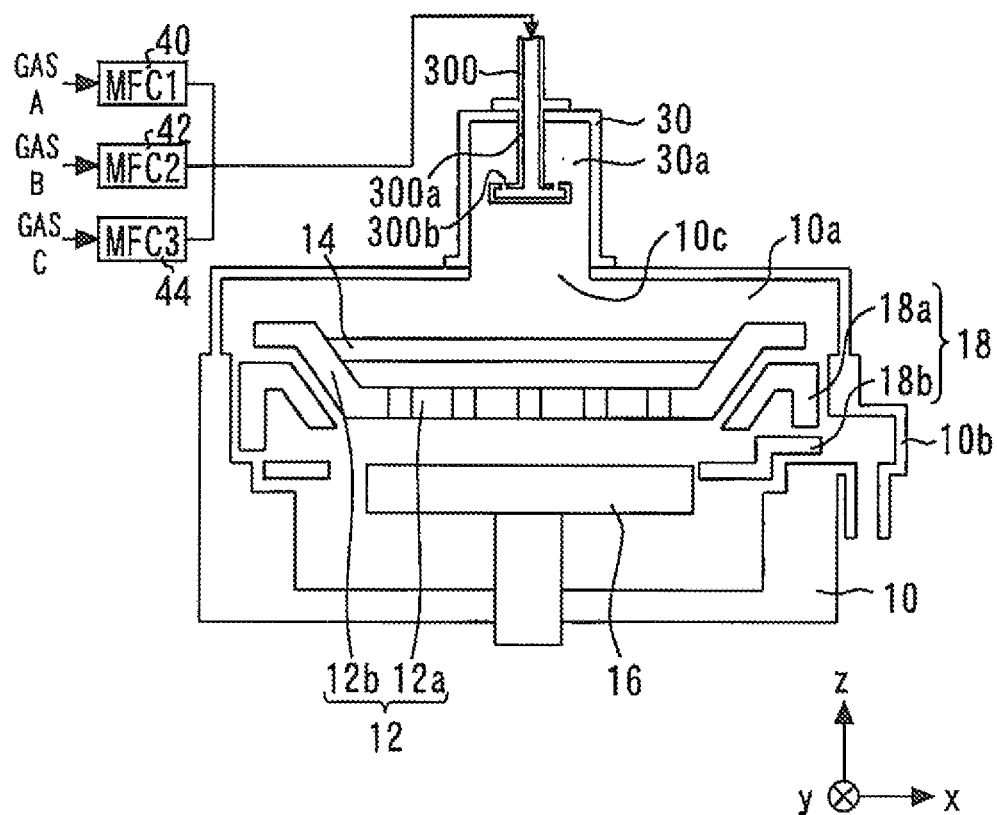
FIG. 14 is a sectional view of the film forming apparatus according to the fourth embodiment.

FIG. 14 is a sectional view of the film forming apparatus according to the fourth embodiment of the present invention. The gas supply tube 300 is mounted on the upper surface of the diffusion tube 30. The gas supply tube 300 extends from above the diffusion tube 30 into the diffusion tube 30 through a portion of the diffusion tube 30. The portion of the gas supply tube 300 in the diffusion space 30a is a distal end portion 300a. Gas supply orifices 300b are formed in the distal end portion 300a. The gas supply orifices 300b are formed so as to eject a material gas in a direction opposite to a direction toward the stage 16.

Figure 15:
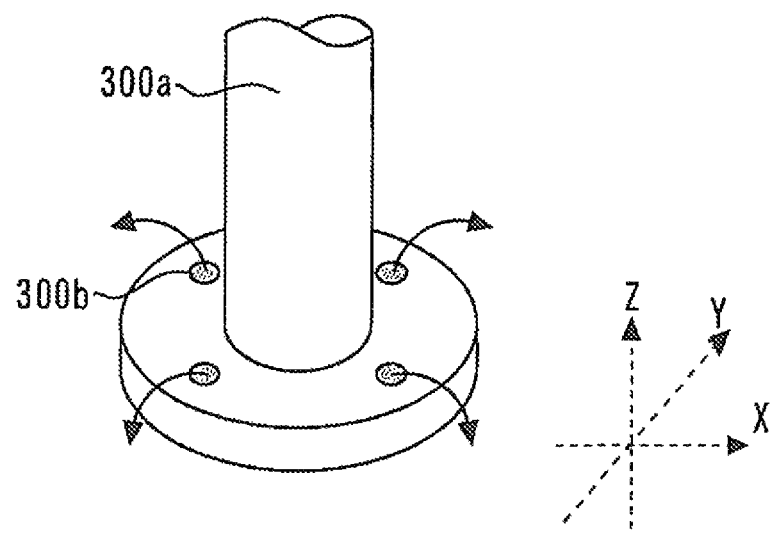
FIG. 15 is a diagram showing an enlarged view of the distal end portion.

FIG. 15 is a diagram showing an enlarged view of the distal end portion 300a. Arrows in FIG. 15 indicate directions along which a material gas is ejected. As shown, also with the arrangement having the gas supply tube 300 mounted on the upper surface of the diffusion tube 30, a material gas can be ejected in directions away from the stage 16. As a result, the material gas is sufficiently diffused in the diffusion space 30a. A suitable combination of the features of the film forming apparatuses according to the embodiments described above may be used.

Obviously many modifications and variations of the present invention are possible in the light of the above teachings. It is therefore to be understood that within the scope of the appended claims the invention may be practiced otherwise than as specifically described.

What is claimed is:
1. A film forming apparatus comprising:
a chamber having a processing space;
a stage provided in the processing space and having a substrate placed thereon;
an electrode provided above the stage and having openings formed therein;
an intermediate plate provided above the electrode, having openings formed therein, and formed of an insulating material;
a diffusion tube positioned above the electrode and the intermediate plate and connected to the chamber so that a diffusion space communicating with the processing space is provided right above the stage; and
a gas supply tube extending from the outside of the diffusion tube into the diffusion space through a portion of the diffusion tube and having a gas supply orifice in a portion thereof inside of the diffusion space,
wherein the gas supply orifice is formed so as to eject a material gas in a direction away from the stage, and
the gas supply orifice is provided only at a center of the diffusion space as viewed in plan.
2. The film forming apparatus according to claim 1, wherein the gas supply orifice is formed so as to eject a gas toward an upper wall surface of the diffusion tube.
3. The film forming apparatus according to claim 1, wherein the opening area of the gas supply orifice is smaller than the sectional area of a hollow space in the gas supply tube.
4. The film forming apparatus according to claim 1, wherein the apparatus is constructed as a plasma film forming apparatus that applies a voltage between the electrode and the stage.

* * * * *